(12) United States Patent
Raman et al.

(10) Patent No.: US 8,679,980 B2
(45) Date of Patent: Mar. 25, 2014

(54) AQUEOUS METAL POLISHING AGENT COMPRISING A POLYMERIC ABRASIV CONTAINING PENDANT FUNCTIONAL GROUPS AND ITS USE IN A CMP PROCESS

(75) Inventors: Vijay Immanuel Raman, Mannheim (DE); Ilshat Gubaydullin, Ludwigshafen (DE); Yuzhuo Li, Heidelberg (DE); Mario Brands, Ludwigshafen (DE); Yongqing Lan, Potsdam (DE)

(73) Assignee: BASF SE, Ludwigshafen (DE)

( * ) Notice: Subject to any disclaimer, the term of this patent is extended or adjusted under 35 U.S.C. 154(b) by 109 days.

(21) Appl. No.: 13/318,911

(22) PCT Filed: Apr. 19, 2010

(86) PCT No.: PCT/EP2010/055121
§ 371 (c)(1),
(2), (4) Date: Nov. 4, 2011

(87) PCT Pub. No.: WO2010/127937
PCT Pub. Date: Nov. 11, 2010

(65) Prior Publication Data
US 2012/0058643 A1 Mar. 8, 2012

(30) Foreign Application Priority Data
May 6, 2009 (EP) ..................... 09159542

(51) Int. Cl.
*H01L 21/302* (2006.01)

(52) U.S. Cl.
USPC ........ 438/693; 252/79.1; 252/79.2; 252/79.3; 252/79.4; 438/689; 438/690; 438/691; 438/692

(58) Field of Classification Search
USPC .......................... 438/689–692; 252/79.1–79.4
See application file for complete search history.

(56) References Cited

U.S. PATENT DOCUMENTS

| | | | |
|---|---|---|---|
| 5,954,997 A * | 9/1999 | Kaufman et al. ............. | 252/79.1 |
| 6,099,604 A * | 8/2000 | Sandhu et al. ................... | 51/307 |
| 6,593,417 B1 * | 7/2003 | Anderson et al. ............. | 524/588 |
| 7,037,351 B2 * | 5/2006 | Li et al. ............. | 51/298 |
| 2001/0020348 A1 | 9/2001 | Ueda et al. | |
| 2004/0253822 A1 | 12/2004 | Matsui et al. | |
| 2005/0076581 A1 | 4/2005 | Small et al. | |
| 2009/0064597 A1 | 3/2009 | Etoh et al. | |
| 2009/0068841 A1 | 3/2009 | Matsui et al. | |
| 2009/0087988 A1 | 4/2009 | Saie | |
| 2010/0148109 A1 | 6/2010 | Schadler et al. | |
| 2010/0178768 A1 | 7/2010 | Li | |
| 2010/0221519 A1 | 9/2010 | Venkatesh et al. | |
| 2010/0261853 A1 | 10/2010 | Gubaydullin et al. | |
| 2010/0284882 A1 | 11/2010 | Koch et al. | |
| 2011/0091733 A1 | 4/2011 | Feuerhake et al. | |
| 2011/0092635 A1 | 4/2011 | Venkatesh et al. | |
| 2011/0189487 A1 | 8/2011 | Zacharias et al. | |
| 2011/0269312 A1 | 11/2011 | Li et al. | |
| 2012/0058643 A1 | 3/2012 | Raman et al. | |

FOREIGN PATENT DOCUMENTS

| | | |
|---|---|---|
| WO | WO 2008/138977 A1 | 11/2008 |
| WO | WO 2008/138978 A1 | 11/2008 |
| WO | WO 2008/151918 A1 | 12/2008 |
| WO | WO 2008/157293 A1 | 12/2008 |
| WO | WO 2009/010443 A2 | 1/2009 |
| WO | WO 2009/027310 A1 | 3/2009 |
| WO | WO 2009/050176 A1 | 4/2009 |
| WO | WO 2009/065928 A1 | 5/2009 |
| WO | WO 2009/065929 A1 | 5/2009 |
| WO | WO 2009/071351 A1 | 6/2009 |
| WO | WO 2009/083044 A1 | 7/2009 |
| WO | WO 2009/083083 A1 | 7/2009 |
| WO | WO 2009/153162 A1 | 12/2009 |
| WO | WO 2009/156341 A1 | 12/2009 |
| WO | WO 2010/037730 A1 | 4/2010 |
| WO | WO 2010/100226 A1 | 9/2010 |
| WO | WO 2010/100227 A1 | 9/2010 |
| WO | WO 2010/100228 A1 | 9/2010 |
| WO | WO 2010/100229 A1 | 9/2010 |
| WO | WO 2010/100232 A2 | 9/2010 |
| WO | WO 2010/100233 A1 | 9/2010 |
| WO | WO 2010/127938 A1 | 11/2010 |

OTHER PUBLICATIONS

U.S. Appl. No. 13/580,039, filed Aug. 20, 2012, Raman, et al.
U.S. Appl. No. 61/102,457, filed Oct. 3, 2008, Li, et al.
U.S. Appl. No. 13/318,964, filed Nov. 4, 2011, Raman, et al.
U.S. Appl. No. 60/944,198, filed Jun. 15, 2007, Li.
U.S. Appl. No. 13/266,520, filed Oct. 27, 2011, Li, et al.
U.S. Appl. No. 13/376,270, filed Dec. 5, 2011, Zhang, et al.
U.S. Appl. No. 13/510,514, filed May 17, 2012, Raman, et al.
U.S. Appl. No. 13/510,830, filed May 18, 2012, Raman, et al.
U.S. Appl. No. 13/503,753, filed Apr. 24, 2012, Lauter, et al.
International Search Report Issued Aug. 26, 2010 in PCT/EP10/055121 Filed Apr. 19, 2010.

* cited by examiner

*Primary Examiner* — Lan Vinh
*Assistant Examiner* — Maki Angadi
(74) *Attorney, Agent, or Firm* — Oblon, Spivak, McClelland, Maier & Neustadt, L.L.P.

(57) ABSTRACT

(A) solid polymer particles being finely dispersed in the aqueous phase and containing pendant functional groups (a1) capable of strongly interacting and forming strong complexes with the metal of the surfaces to be polished, and pendant functional groups (a2) capable of interacting less strongly with the metal of the surfaces to be polished than the functional groups (a1); and (B) an organic non-polymeric compound dissolved in the aqueous phase and capable of interacting and forming strong, water-soluble complexes with the metal of the surfaces to be polished and causing an increase of the material removal rate MRR and the static etch rate SER of the metal surfaces to be polished with increasing concentration of the compound (B); a CMP process comprising selecting (A) and (B) and the use of the CMP agent and process for polishing wafers with ICs.

24 Claims, No Drawings

AQUEOUS METAL POLISHING AGENT COMPRISING A POLYMERIC ABRASIV CONTAINING PENDANT FUNCTIONAL GROUPS AND ITS USE IN A CMP PROCESS

FIELD OF THE INVENTION

The invention is directed to a novel aqueous polishing agent and its use in a novel process for polishing, in particular for the chemical mechanical polishing (CMP), of patterned and unstructured metal surfaces.

BACKGROUND OF THE INVENTION

Integrated circuits (ICs) consist of structured electrically semiconducting, non-conducting and conducting thin layers. These patterned layers are customarily prepared by applying a layer material, for example, by vapor deposition and patterning it by a microlithographic process. By way of the combination of the various electrically semiconducting, non-conducting and conducting layered materials the electronic circuit elements such as transistors, capacitors, resistors and wirings are fabricated.

The quality of an IC and of its function depends particularly on the precision with which the various layer materials can be applied and patterned.

However, with an increasing number of layers the planarity of the layers decreases significantly. This leads to the failure of one or more functional elements of the IC and, therefore, to the failure of the complete IC after a certain number of layers has been reached.

The decrease of the planarity of the layers is caused by the buildup of new layers on top of layers already patterned. By the patterning altitude differences are created which can add up to 0.6 μm per layer. These altitude differences add up from layer to layer and bring about that the next following layer can no longer be applied onto a planar surface but only onto an uneven surface. The first result is that the layer subsequently applied has an irregular thickness. In extreme cases, imperfections, defects in the electronic functional elements and lacking electrical contacts are caused. Moreover, uneven surfaces lead to problems with the patterning. In order to be able to create sufficiently small patterns, an extremely acute depth of focus is a necessary in the microlithographic process step. However, these patterns can only be imaged with acuity on a planar surface. The more the locations deviate from the planarity, the murkier the image becomes.

In order to solve this problem, a so-called chemical mechanical polishing (CMP) is carried out. The CMP causes a global planarization of the patterned surface by the removal of protruding features of the layer until a planar layer is obtained. Because of this, the subsequent buildup can take place on top of a planar surface exhibiting no altitude differences, and the precision of the patterning and of the functionality of the elements of the IC is maintained.

Typical examples for the global planarization are dielectric CMP, nickel phosphide CMP and silicium or polysilicium CMP.

In addition to the global planarization to overcome lithographical difficulties, there are two other important applications for CMP. One is to fabricate microstructures. Typical examples for this application are copper CMP, tungsten CMP or shallow trench isolation (STI) CMP, in particular the Damascene process described below. The other is defect correction or elimination, as for example sapphire CMP.

A CMP process step is carried out with the help of special polishers, polishing pads and polishing agents which are also referred to in the art as polishing slurries or CMP slurries. A CMP slurry is a composition, which in combination with the polishing pad causes the removal of the material to be polished.

In case that wafers with semiconductor layers are to be polished, the precision requirements for the process step and, thus, the requirements set for the CMP slurry are particularly strict.

A series of parameters are used for evaluating the efficiency of CMP slurries and for characterizing their activity. The material removal rate (MRR), that is the speed with which the material to be polished is removed, the selectivity, that is the ratio of the removal rate of the material to be polished to the removal rates of other materials present, the removal uniformity within a wafer (WIWNU; within wafer non-uniformity) and the removal uniformity from wafer to wafer (WTWNU; wafer to wafer non-uniformity) as well as the number of defects per unit of area rank among these parameters.

The copper Damascene process is increasingly used for the fabrication of IC (cf., for example, the European patent application EP 1 306 415 A2, page 2, paragraph [0012]). In order to produce the copper circuit paths, it is necessary to remove a copper layer chemically mechanically in this process with the help of a CMP slurry, which process is also called "copper CMP process" in the art. The completed copper circuit paths are embedded in a dielectric. Customarily, a barrier layer is located between the copper and the dielectric.

The CMP agents or slurries customarily used in these CMP processes contain dispersed, colloidal inorganic particles such as silica particles as abrasive materials.

For example, the US patent application U.S. 2006/0243702 A1 discloses a CMP slurry containing colloidal silica as an abrasive material, organic polymeric particles such as polymethyl methacrylate or polystyrene particles which may be integrated with the colloidal silica to form a complex particle, an oxidizing agent such as hydrogen peroxide, a water-soluble polymeric compound such as polyvinylpyrrolidone or polyvinyl alcohol, a first complexing agent forming a water-insoluble complex with copper, having a wet etching rate of less than 3 nm/min and acting as a protective film forming agent, such as quinaldinic acid, quinolinic acid, benzotriazole BTA, benzoimidazole, 7-hydroxy-5-methyl-1,3,4-triazaindolizine, nicotinic acid and picolinic acid, a second complexing agent forming a water-soluble complex with copper, having a wet etching rate of more than 3 nm/min and acting as a polishing-accelerating agent, such as amino acids, as for example, glycine, alanine or trypophane, or organic acids, such as formic acid, lactic acid, acetic acid, tartaric acid, fumaric acid, glycol acid, phthalic acid, maleic acid, oxalic acid, citric acid, malic acid, malonic acid or glutamic acid or their basic salts with ammonia, ethylene diamine or tetramethyl ammonium hydroxide TMAH, and surfactants.

However, there are several disadvantages associated with the use of inorganic particles. Due to their high densities, they have a tendency to settle out of their aqueous dispersions. Consequently, the respective CMP agents or slurries can be unstable. Moreover, these CMP agents fail to adequately control dishing and erosion, corrosion, defects of the surface, polishing rate and selectivity among different materials on the surface. Quite often, the inorganic particles and their aggregates cause scratches in the polished surfaces. However, for obvious reasons, such scratches have to be avoided. Moreover, the various amounts of the first complexing agent and the second complexing agent have to be balanced very carefully: if the amount of the first complexing agent is chosen too high, the MRR is decreased to an undesirable extent (in extreme cases down to 0 nm/min); if the amount of the second complexing agent is chosen to high, the static etch rate SER is increased to an undesirable extent. Both effects leads to a disadvantageous decrease in planarization efficiency.

These problems have been ameliorated to a certain degree by the use of organic particles as the abrasive materials.

For example, the European patent application EP 0 919 602 A1 discloses a CMP slurry comprising
- polymeric particles prepared by emulsion polymerization and containing functional groups such as amide groups, hydroxyl groups, methoxy groups or glycidyl groups,
- an oxidizing agent, such as hydrogen peroxide, and
- a complexing agent forming a water-soluble complex with copper, such as ammonium fluoride, acetylacetone, citric acid, tartaric acid, glycine, catechol, lysine and 2-aminoethanesulfonicacid.

A similar CMP slurry is disclosed by the European patent application EP 1 036 836 A1, the said CMP slurry containing
- polymeric particles prepared by emulsion polymerization and containing hydrophilic functional groups, as for example, polymeric particles consisting of copolymerized methyl methacrylate, methoxypolyethyleneglycol methacrylate, 4-vinylpyridine and containing amino, pyridyl, polyether and ester groups,
- colloidal inorganic particles such as fumed silica particles,
- an oxidizing agent such as hydrogen peroxide, and
- an organic acid such as p-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid, phthalic acid, quinaldinic acid, quinolinic acid, nicotinic acid and picolinic acid for improving the polishing rate.

It is mandatory that the zeta potential of the polymeric particles and the zeta potential of the inorganic particles are of the opposite signs so that both kinds of particles are electrostatically bonded to form composite particles. However, this can cause an undesirable agglomeration of the particles.

Moreover, the European patent EP 1 077 240 B1 discloses a CMP slurry comprising
- polymeric particles prepared by radical polymerization of olefinically unsaturated comonomers and containing functional groups such as amino, pyridyl or acrylamide groups that can react with the metal of the surface to be polished,
- a complexing agent such as benzotriazole BTA, tolyltriazole, thiourea, benzoimidazole, benzofloxane, 1,2,3-benzothiadiazole, 2-mercaptobenzothiazole, 2-mercaptobenzothiadiazole, 2-mercaptobenzooxazole, melamine, salicylaldoxime, o-phenylenediamine, m-phenylenediamine, catechol and o-aminophenol,
- an oxidizing agent such as potassium persulfate, and
- a complexing agent acting as a passivating agent selected from the group of complexing agents, in particular, salicylaldoxime, benzotriazole BTA, quinaldinic acid or 7-hydroxy-5-methyl-1,3,4-triazaindolizine.

However, the problem of staining is not completely resolved by the known CMP slurries. Due to the high density of functional groups such as amino groups or pyridyl groups, the polymeric particles are strongly absorbed on the metal surfaces to be polished, in particular, copper surfaces, which, on the one hand, helps to increase the material removal rate MRR but, on the other hand, leaves the polished surface stained. On the other hand, it frequently happens that no staining occurs but then the MRR can become so low as to be impractical; in extreme cases the MRR is reduced to 0 nm/min. Moreover, as some of the known CMP slurries must also contain inorganic colloidal particles, the danger of scratching is still present.

The problem of scratching can be resolved to a certain degree by a CMP slurry known from the international patent application WO 2005/014753 A1 and comprising
- organic polymeric particles consisting of melamine-formaldehyde resins as well as
- organic non-polymeric particles consisting of melamine, melamine derivatives such as acetoguanamine, benzoguanamine and dicyandiamide, and their salts as the abrasive materials,
- an oxidizing agent,
- a chelating agent such as a polyamine like ethylenediamine, 2,2'-bipyridine or diethylenetriamine, a polyaminocarboxylic acid like nitrilotriacetic acid, ethylenediaminetetraacetic acid or diethylenetriaminepentaacetic acid and their sodium or potassium salts, and an amino acid like glycine, and
- a passivating agent like a phosphate, benzotriazole BTA, benzothiazole, 1-H-benzotriazoleacetonitrile, benzotriazole-5-carboxylic acid, 2(3H)-benzothiazolone and 1-H-benzotriazole-1-methanol.

It is believed that the melamine particles of this prior art CMP slurry are broken up by the shearing forces during CMP at the peaks on the surfaces to be polished. In this way, a high concentration of melamine is generated in situ at these locations, which concentration, in turn, leads to a high material removal rate MRR. However, the static etch SER is also high, whereby the planarization efficiency is decreased. In addition to this, the CMP slurry can still leaves stains on the polished surfaces. Moreover, the effective concentration of the oxidizing agent can be decreased when too high an amount of organic non-polymeric particles is used.

OBJECTS OF THE INVENTION

It was the object of the present invention to provide novel aqueous polishing agents for the polishing, in particular for the CMP of patterned and unstructured metal surfaces, preferably of patterned metal surfaces, more preferably of metal patterns embedded in dielectric materials, in particular copper containing patterns, which novel polishing agents do not exhibit the disadvantages of the prior art.

In particular, the novel aqueous polishing agents ought to have an excellent polishing efficiency without causing dishing during the copper damascene process. The novel aqueous polishing agents ought to exhibit no undesired corrosive effects and ought not to effectuate defects, scratches and pitting in the materials to be polished.

Additionally, the novel aqueous polishing agents should not leave stains on the polished surfaces and exhibit a low static etch rate SER and a high material removal rate MRR so that the planarization efficiency is high.

Moreover, it was the object of the invention to provide a novel polishing process, preferably a novel CMP process for polishing, preferably for chemically and mechanically polishing, patterned and unstructured, preferably patterned metal surfaces, most preferably metal surfaces embedded in dielectric materials, and particularly of copper containing structures, which novel polishing process does no longer exhibit the disadvantages of the prior art and does not effectuate dishing in the materials to be polished and does not lead to undesired corrosion and to defects, scratches and pitting in the materials to be polished and exhibits a high planarization efficiency and does not leave stains on the polished surfaces.

SUMMARY OF INVENTION

Accordingly, the novel aqueous polishing agent has been found, comprising (A) at least one type of solid polymer particles as an abrasive, the said polymer particles being finely dispersed in the aqueous phase and containing pendant functional groups (a1) capable of strongly interacting with the metal and/or the metal oxides on top of the surfaces to be polished and forming strong complexes with the said metal, and pendant functional groups (a2) capable of interacting less strongly with the metal of the surfaces to be polished than the functional groups (a1); and (B) at least one organic non-polymeric compound as a complexing agent, the said compound being dissolved in the aqueous phase and capable of interacting with the metal of and/or the metal oxides on top of the surfaces to be polished, forming strong, water-soluble complexes with the said metal, and causing an increase of the material removal rate MRR and the static etch rate SER of the metal surfaces to be polished with increasing concentration of the compound (B) in the aqueous polishing agent.

Hereinafter, the novel aqueous polishing agent is referred to as the "CMP agent of the invention".

Additionally, a novel process for the chemical and mechanical polishing of patterned and unstructured metal surfaces has been found, comprising the steps of (I) selecting at least one type of solid polymer particles (A) which can be finely dispersed in the aqueous phase and are capable of strongly interacting with the metal of and/or the metal oxides on top of the surfaces to be polished and forming strong complexes with the metal of the surfaces to be polished, as an abrasive;

(II) selecting at least one organic non-polymeric compound which can be dissolved in the aqueous phase and is capable of interacting with the metal of and/or the metal oxides on top of the surfaces to be polished, forming strong, water-soluble complexes with the said metal, and causing an increase of the material removal rate MRR and the static etch rate SER of the metal surfaces to be polished with increasing concentration of the compound (B) in the aqueous polishing agent, as a complexing agent;

(III) preparing an aqueous polishing agent containing the solid polymer particles (A) and the complexing agent (B); and (IV) chemically and mechanically polishing the said metal surfaces.

Hereinafter, the novel process for the chemical and mechanical polishing of patterned and unstructured surfaces is referred to as the "CMP process of the invention"

Last but not least, the novel use of the CMP agent of the invention and of the CMP process of the invention for the production of wafers containing integrated circuits has been found, which use is hereinafter referred to as the "use of the invention".

ADVANTAGES OF THE INVENTION

In view of the prior art discussed above, it was surprising and could not be expected by the skilled artisan that the objects underlying the present invention could be solved by the CMP agent, the CMP process and the use of the invention.

In particular, it was surprising that the CMP agent of the invention was excellently suited for the CMP of patterned and unstructured metal surfaces, preferably of patterned metal surfaces, more preferably of metal patterns embedded in dielectric materials, in particular copper containing patterns, and did not exhibit the disadvantages of the prior art.

In particular, the CMP agent of the invention had an excellent polishing efficiency without causing dishing during the copper damascene process. The CMP agent of the invention exhibited no undesired corrosive effects and did not to effectuate defects, scratches and pitting in the materials to be polished.

Additionally, the CMP agent of the invention did not leave stains on the polished surfaces and exhibited a low static rate SER and a high material removal rate MRR so that the planarization efficiency was high.

Moreover, the CMP process of invention was also excellently suited for polishing, preferably for chemically and mechanically polishing, patterned and unstructured, preferably patterned metal surfaces, most preferably metal surfaces embedded in dielectric materials, and particularly of copper containing structures, and did no longer exhibit the disadvantages of the prior art. In particular, it did not effectuate dishing in the materials to be polished and did not lead to undesired corrosion and to defects, scratches and pitting in the materials to be polished, exhibited a high planarization efficiency and did not leave stains on the polished surfaces.

All in accordance with the use of the invention, the CMP agent and the CMP process of the invention were excellently suited for the production of wafers containing copper damascene patterns. Therefore, an exceptionally high fabrication efficiency in the production of a ultrahigh density integrated circuits (ICs) could be achieved.

DETAILED DESCRIPTION OF THE INVENTION

The CMP agent of the invention is based on the careful selection of its essential components (A) and (B).

The CMP agent of the invention comprises at least one type, preferably one type, of solid polymer particles (A) as the first essential component.

The solid polymer particles (A) are stable under the conditions of the CMP process of the invention hereinafter described. The term "stable" means that the concerned solid polymer particles (A) are neither partially nor completely destroyed by the chemical action of the other constituents of the CMP agents of the invention and of the materials to be polished and by the mechanical effects during polishing under pressure, in particular by the shearing forces during the CMP process of the invention.

The properties of the solid polymer particles (A) can be adjusted by the selection of the molecular weight, the surface functionality, the glass transition temperature and the structure of the particles (A) described below.

Preferably, the number average molecular weight is high, more preferably, higher than 10,000 Dalton, more preferably higher than 100,000 Dalton and most preferably higher than 1,000,000 Dalton. In the case of cross-linked solid polymer particles (A) the number average molecular weight is theoretically infinite.

Preferably, their glass transition temperature is above room temperature, more preferably above 50° C. and most preferably above 100° C. as measured by differential scanning calorimetry DSC.

The solid polymer particles (A) are finely dispersed in the aqueous phase of the CMP agent of the invention. Their particle size can vary broadly. Preferably, they have a particle size in the range of from 1 to 500 nm, more preferably 5 to 300 nm, most preferably 10 to 250 nm and particularly 20 to 200 nm as measured by HPPS dynamic light scattering.

The particle size distribution can be monomodal or multimodal, in particular, bimodal. In order to have an easily reproducible property profile and easily reproducible conditions during the CMP process of the invention, a monomodal particle size distribution is most particularly preferred. The particle size distribution can also vary broadly. In order to have an easily reproducible property profile and easily reproducible conditions during the CMP process of the invention a narrow particle size distribution is preferred. Most preferably, the mean particle size $d_{50}$ is in the range of from 2 to 450 nm, more preferably 10 to 250 nm, most preferably 20 to 200 nm and particularly 25 to 150 nm as measured by HPPS dynamic light scattering.

The solid polymer particles (A) are capable of interacting with the metal of and/or the metal oxides on top of the surfaces to be polished. "Interaction" or "interacting" means that the solid polymer particles (A) have a strong affinity to the said metal surface and/or the metal oxides on top of it generated during the CMP process of the invention and are physically and/or chemically adsorbed by the said surface. The physical adsorption is accomplished, for example, by electrostatic attraction and/or Van der Waals forces. The chemical adsorption is accomplished, for example, by the formation of ionic or covalent bonds.

In the context of the present invention the term "metal" also includes metal alloys. Preferably, the metal has a standard reduction potential $E°>-0.1$ V, preferably $>0$ V, most preferably $>0.1$ V and in particular $>0.2$ V for the half-reaction $$M \leftrightharpoons M^{n+} + n\ e^-,$$ wherein n=integer of from 1 to 4 and $e^-$=electron.

Examples for such standard reduction potentials $E°>-0.1$ are listed in the CRC Handbook of Chemistry and Physics, 79th edition, 1998-1999, CRC Press LLC, Electrochemical Series, 8-21 to 8-31.

Preferably, the metal is selected from the group consisting of Ag, Au, Bi, Cu, Ge, Ir, Os, Pd, Pt, Re, Rh, Ru, Tl and W, most preferably Ag, Au, Cu, Ir, Os, Pd, Pt, Re, Rh, Ru and W. In particular, the metal is copper.

The interaction of the solid polymer particles (A) is accomplished by way of pendant functional groups (a1) which are capable of strongly interacting with the metal of and the metal oxides on top of the surfaces to be polished and which, moreover, are capable of forming strong complexes with the said metal, and also by way of pendant functional groups (a2) which are capable of interacting less strongly with the metal of the surfaces to be polished than the functional groups (a1).

The pendant functional groups (a1)) can form strong complexes with the zerovalent metal atoms and/or the respective metal cations. "Strong" means that the complexes have a very low dissociation constant due to a high thermodynamic and/or kinetic stability so that the chemical equilibrium is shifted to the side of the complexes.

The pendant functional group (a2) may form only weak complexes with the zerovalent metal atoms and/or the respective metal cations or they may form no complexes at all, because they have to compete for the metal atoms and/or metal cations with the pendant functional groups (a1).

Preferably, the pendant functional groups (a1)) are terminal and/or side groups which are attached to the polymer chains of the solid polymer particles (A). In principle, any group capable of forming a strong bonds between the zerovalent metal atoms or metal cations, in particular, copper and copper cations, can be used as the pendant functional groups (a1). More preferably, the functional groups are cationic groups or groups capable of forming cations in an acidic aqueous phase. Most preferably, the pendant functional groups (a1) are selected from the group consisting of primary, secondary and tertiary amino groups and quaternary ammonium groups.

Preferably, the pendant functional groups (a2) are also terminal and/or side groups which are attached to the polymer chains of the solid polymer particles (A). In principle, any group which interacts less strongly with the metal of the surfaces to be polished, in particular, with copper, than the pendant functional groups (a1) can be used.

More preferably, the pendant functional groups (a2) do not react with the pendant functional groups (a1), as for example, under the formation of ionic or covalent bonds and/or under the formation of smaller molecules, as for example, water or carbon dioxide.

Even more preferably, the pendant functional groups (a2) are hydrophilic. Most preferably, they are selected from the group consisting of anionic groups, groups capable of forming anions in the presence of bases, and neutral donor groups.

Most particularly preferably, the anionic groups (a2) are selected from the group consisting of carboxylate, sulfonate and phosphonate groups, the groups (a2) capable of forming anions in the presence of bases are selected from the group consisting of carboxylic acid, sulfonic acid and phosphonic acid groups, and the neutral donor groups (a2) are selected from the group consisting of hydroxyl groups, aliphatic and aromatic ether groups, such as methoxy and phenoxy groups, and aliphatic and aromatic polyether groups, such as poly(ethyleneoxide) and poly(phenyleneoxide) groups.

The capability of the solid polymer particles (A) of forming strong complexes is also influenced by the chemical nature of their polymer chains, their outer shape and their structure.

Thus, the solid polymer particles (A) can have different shapes. For example, they can have the shape of cubes, cubes with champfered edges, octahedrons, icosahedrons, nodules or spheres with or without protrusions or indentations. Preferably, they are spherical with no or only very few protrusions or indentations because this shape increases both, the resistance to the mechanical forces the particles are exposed to during the CMP process of the invention and the chemical stability to the other components of the CMP agent of the invention.

Moreover, they can be homogeneous materials or inhomogeneous materials such as composite materials or materials with core-shell structures. They can be hollow or compact. Or they can have a spongy structure with a high specific surface capable of absorbing metal atoms or cations. Preferably, they are compact because the compactness increases both, the resistance of the particles (A) to the mechanical forces and their chemical stability.

Additionally, they can have a dendrimeric structure with a high number of functional groups at the periphery of the dendrimeric structure. Or they can contain or consist of non-cross-linked, entangled, linear or slightly branched polymer chains. Preferably, they contain or consist of cross-linked polymer chains, because this further increases both, the resistance of the particles (A) to the mechanical forces and their chemical stability.

Preferably, the solid polymer particles (A) are selected from the group of cross-linked polymers containing or consisting of polymer chains selected from the group consisting of copolymers and polymers (A1) obtainable by condensation polymerization, copolymers and polymers (A2) obtainable by addition polymerization, and polymers and copolymers (A3) obtainable by anionic, cationic or radical polymerization of olefinically unsaturated monomers.

More preferably, the solid polymer particles (A) consist of polymer chains selected from the group consisting of condensation copolymers and polymers (A1) and/or addition copolymers and polymers (A2) as well as copolymers and polymers (A3) obtainable by anionic, cationic or radical polymerization of olefinically unsaturated monomers.

More preferably, the copolymers and polymers (A3) are obtainable by anionic, cationic or radical copolymerization of olefinically unsaturated comonomers, most preferably, by the radical copolymerization of olefinically, in particular, ethylenically unsaturated comonomers in solution, emulsion or suspension, in particular, in emulsion. Most preferably, at least one of the comonomers contains at least two olefinically, in particular, ethylenically unsaturated groups for the cross-linking of the copolymer chains (A3).

The polymers chains (A1), (A2) and (A3) themselves can be selected from the group consisting of linear, branched or comb-like polymer chains. In the case of the copolymers they can contain the copolymerized monomers in a statistical, alternating and/or block-like distribution.

Preferably, the condensation copolymers and polymers (A1) and the addition copolymers and polymers (A2) are selected from the group consisting of polyesters, alkyd resins, polyurethanes, polylactones, polycarbonates, polyethers, epoxy resin-amine adducts, polyureas, polyamides, polyimides, polyester-polyurethanes, polyether-polyurethanes and polyester-polyether-polyurethanes.

Preferably, the copolymers and polymers (A3) obtained by the anionic, cationic and radical polymerization of olefinically unsaturated monomers and comonomers are selected from the group of acrylate and methacrylate polymers and copolymers, in particular, acrylate and methacrylate copolymers. The said copolymers can contain minor amounts of olefinically unsaturated comonomers other than the acrylate and methacrylate comonomers, as for example, vinyl aromatic compounds. Such polymers and copolymers (A3) or described, for example, in the European patent EP 1 077 240 B1, page 3, paragraph [0018] to page 4, paragraph [0028] and page 4, paragraph [0032] to page 6, paragraph [0046].

It is particularly preferred that the pendant functional groups (a1) and (a2) are concentrated on the outer surface of the solid polymer particles (A).

It is more particularly preferred that the pendant functional groups (a1) and (a2) are concentrated in different oligomeric and/or polymeric subunits (a1) and (a2).

It is even more particularly preferred that, in the solid polymer particles (A), the pendant functional groups (a1) and (a2) are attached to a polymeric, in particular a cross-linked polymeric subunit (a3), preferably by covalent bonds.

It is even more particularly preferred that the cross-linked polymeric subunit (a3) is essentially or completely free from pendant functional groups (a1) and (a2).

The oligomeric and polymeric subunits (a1), (a2) and (a3) can be derived from the group consisting of oligomeric and polymeric chains derived from the oligomers and polymers (A1), (A2) and (A3) hereinbefore described. Preferably, the subunit (a3) is selected from the group of polymeric chains derived from the polymers (A3).

Preferably, the oligomeric and polymeric subunits (a1) are obtainable from oligomers and polymers (A1) selected from the group consisting of polymeric basic amino acids, more preferably, polylysine, polyarginine and polyhistidine, most preferably, polylysine, and polyimines, polylysine being most particularly preferably used.

Preferably, the oligomeric and polymeric subunits (a2) are obtainable from oligomers and polymers (A1), (A2) and (A3) selected from the group consisting of polyvinyl alcohols, polyethers, more preferably, poly(ethyleneoxide), polymeric acidic amino acids, more preferably, polyglutamic acid and polyaspartic acid, and oligomers and polymers of olefinically unsaturated monomers containing at least one carboxylic acid, sulfonic acid and phosphonic acid group, more preferably, polyvinylsulfonic acid, polyvinylphosphonic acid, polyacrylic acid and polymethacrylic acid, in particular, polyacrylic acid, polyvinyl alcohols being most particularly preferably used.

The solid polymer particles (A) most particularly preferably used are obtainable by preparing copolymeric subunits (a3) from a mixture of monomers comprising at least one monomer having at least one complimentary functional group (a4), preferably an aziridine group or an oxirane group, more preferably an oxirane group, capable of reacting with the functional groups (a1) and (a2), in the presence of at least one subunit (a1)) precursor oligomer or polymer and at least one subunit (a2) precursor oligomer or polymer.

Preferably, the monomer having at least one complimentary functional group (a4) is selected from the group consisting of glycidyl acrylate and glycidyl methacrylate, with glycidyl methacrylate being most preferably used.

In the context of the present invention the terms "oligomeric" or "oligomeric" mean that the materials concerned have an average degree of polymerization not higher than 12, whereas the terms "polymeric" or "polymer" mean that the materials concerned have an average degree of polymerization higher than 12.

The CMP agents of the invention can contain the first essential component, namely the solid polymer particles (A), in varying amounts. Preferably, the amount of the first essential component (A) is from 0.1 to 20% by weight, more preferably 0.2 to 15% by weight, most preferably 0.3 to 10% by weight and particularly 0.5 to 5% by weight, based on the complete weight of a given CMP agent of the invention.

The CMP agent of the invention contains at least one, in particular one, organic non-polymeric compound (B) as the second essential component. The organic non-polymeric compound (B) is also referred to as "complexing agent (B)".

The complexing agent (B) can be dissolved in the aqueous phase of the CMP agent of the invention. It is capable of interacting with the metal of and/or the metal oxides on top of the surfaces to be polished. "Interaction" or "interacting" means that the complexing agent (B) has a strong affinity to the said metal surface and/or the metal oxides on top of it generated during the CMP process of the invention. It is furthermore capable of forming strong, water-soluble complexes with the said metals, in particular, copper. These strong complexes can be formed with the zerovalent metal atoms and/or the respective metal cations. "Strong" means that the complexes have a very low dissociation constant due to a high thermodynamic and/or kinetic stability so that the chemical equilibrium is shifted to the side of the complexes.

It is essential that the complexing agent (B) causes an increase of the material removal rate MRR of the metal surfaces to be polished with increasing concentration of the complexing agent (B) in the CMP agent of the invention, in particular, under the conditions of the CMP process of the invention.

Moreover, it is also essential that the complexing agent (B) causes an increase of the static etch rate SER of the metal surfaces to be polished with increasing concentration of the complexing agent (B) in the CMP agent of the invention.

The skilled artisan can select suitable complexing agents (B) by varying their amounts, leaving the amounts of all the other components of the CMP agent of the invention constant and measuring the MRR and SER of the respective CMP agents of the invention.

In principle, all organic non-polymeric compounds having the property profile described above can be selected as the complexing agent (B).

Preferably, the complexing agent (B) is selected from the group consisting of polyamines, carboxylic acids, polyaminocarboxylic acids and basic amino acids.

More preferably, the polyamine (B) is selected from the group consisting of ethylenediamine, propylenediamine and diethylenetriamine.

More preferably, the carboxylic acid (B) is selected from the group consisting of p-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid.

More preferably, the polyaminocarboxylic acid (B) is selected from the group consisting of nitrilotriacetic acid, ethylenediaminetetraacetic acid and diethylenetriaminepentaacetic acid.

More preferably, the amino acid (B) is selected from the group consisting of glycine, lysine, arginine and histidine, most preferably glycine and lysine.

The amino acids (B) are particularly preferably used, with glycine being most particularly preferably use.

The CMP agent of the invention can furthermore contain at least one additional component (C) customarily used in the art of CMP. Preferably, the additional component is the selected from the group of oxidizing agents, surfactants, polyvalent metal ions, pH regulators, solid particles based on dicyandiamide and triazines containing at least one primary amino group, and solid inorganic particles, more preferably oxidizing agents and pH regulators. The additional component (C) is preferably used in the known effective amounts.

Suitable oxidizing agents (C) and their effective amounts are known, for example, from the European patent application EP 1 036 836 A1, page 8, paragraphs [0074] and [0075]. Preferably, organic and inorganic peroxides, more preferably inorganic peroxides, are used. In particular, hydrogen peroxide is used.

Suitable surfactants (C) and their effective amounts are known, for example, from the international patent application WO 2005/014753 A1, page 8, line 23, to page 10, line 17.

Suitable polyvalent metal ions (C) and their effective amounts are known, for example, from the European patent application EP 1 036 836 A1, page 8, paragraph [0076] to page 9, paragraph [0078].

Suitable pH regulators (C) are known, for example, from the European patent application EP 1 036 836 A1, page 8, paragraphs [0080], [0085] and [0086], or the international patent application WO 2005/014753 A1, page 12, lines 19 to 24. Most preferably, the pH of the CMP agent of the invention is adjusted to 3 to 7, particularly 4 to 6.

Suitable solid particles (C) based on dicyandiamide and triazines containing at least one primary amino groups and their effective amounts are known, for example, from the international patent applications WO 2005/014753 A1 and WO 2006/074248 A2.

Suitable solid inorganic particles (C) which may be used as inorganic abrasive particles and their effective amounts are known, for example, from the international patent application WO 2005/014753 A1, page 12, lines 1 to 8. However, it is particularly preferred that the CMP agent of the invention does not contain any solid inorganic particles (C).

The CMP agent of the invention is preferably prepared in the course of the CMP process of the invention, which comprises the steps of (I) selecting at least one type of solid polymer particles (A) which can be finely dispersed in the aqueous phase and are capable of
  strongly interacting with the metal of and/or the metal oxides on top of the surfaces to be polished and
  forming strong complexes with the metal of the surfaces to be polished,
  as an abrasive, in particular, the solid polymer particles (A) as described hereinbefore;

(II) selecting at least one organic non-polymeric compound (B) which can be dissolved in the aqueous phase and is capable of
  interacting with the metal of and/or the metal oxides on top of the surfaces to be polished,
  forming strong, water-soluble complexes with the said metal, and
  causing an increase of the material removal rate MRR and the static etch rate SER of the metal surfaces to be polished with increasing concentration of the compound (B) in the aqueous polishing agent,
  as a complexing agent, in particular, a complexing agent (B) as described herein before;

(IIa) optionally selecting at least one additional component (C), in particular, an additional component (C) as described hereinbefore;

(III) preparing an aqueous polishing agent containing the solid polymeric particles (A) and the complexing agent (B); and (IV) chemically and mechanically polishing the said metal surfaces.

The preparation of the CMP agents of the invention does not exhibit any particularities but can be carried out by dissolving or dispersing the above-described constituents (A) and (B) and optionally (C) in an aqueous medium, in particular, de-ionized water For this purpose, the customary and standard mixing processes and mixing apparatuses such as agitated vessels, in-line dissolvers, high shear impellers, ultrasonic mixers, homogenizer nozzles or counterflow mixers, can be used. Preferably, the CMP agents of the invention thus obtained are filtered through filters of the appropriate mesh aperture, in order to remove coarse-grained particles such as the agglomerates or aggregates of the solid, finely dispersed abrasives (A).

The CMP agents of the invention are used for the CMP of the most diverse patterned and unstructured, in particular patterned metal surfaces.

Preferably, the patterned metal surfaces consist of metal patterns and metal-dielectric patterns. Most preferably, the metal patterns and the metal-dielectric patterns contain or consist of at least one, in particular one metallic material selected from the group consisting of the metals as defined above and their alloys. In particular, copper is used as the metal.

As the dielectrics, the customarily used organic and inorganic dielectrics can be employed. Examples of suitable dielectrics are known from the European patent application EP 1 306 415 A2, page 4, paragraph [0031]. In particular, silicon dioxide is used as the dielectric.

In particular, the metal-dielectric patterns concern copper-dielectric patterns used in the copper damascene process for the fabrication of wafers with ICs, in particular ultra-high-density ICs.

As is known in the art, the metal-dielectric patterns, in particular the copper-dielectric patterns, can contain customarily used barrier layers. Examples of suitable barrier layers are also known from the European patent application EP 1 306 415 A2, page 4, paragraph [0032].

The polishing process of the invention exhibits no particularities but can be carried out with the processes and the equipment customarily used for the CMP in the fabrication of wafers with ICs.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the aqueous CMP agent of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

By way of the CMP process of the invention and the CMP agent of the invention wafers with ICs comprising copper damascene patterns can be obtained which have an excellent functionality.

EXAMPLES AND COMPARATIVE EXAMPLES

Synthesis Example 1 (Comparative)

Preparation of Solid Polymer Particles Only Containing Functional Groups That Strongly Interact With Copper A 2 L reaction flask fitted with an anchor stirrer, a reflux condenser and three feeding lines for feeding at room temperature, was charged under nitrogen with 870 g of deionized water, 35 g of an aqueous solution containing 57% by weight, based on the solution, of polylysine and 4 g of formic acid. The contents of the flask were heated up to 90° C. During the heating 4 g of glycidylmethacrylate GMA were added when a temperature of 60° C. was reached. At 90° C., a monomer feed consisting of 85 g of styrene, 15 g of divinylbenzene and 2 g GMA was started and continually fed to the reaction flask for 2 hours. At the same time, an initiator feed consisting of 80 g of deionized water and 3 g of V-50 (initiator from Wako) was started and continually fed to the reaction flask for 2 hours.

The obtained reaction mixture was post-polymerized for 1 hour at 90° C. and then cooled to room temperature. A dispersion of solid polymer particles with a solids content of 11% by weight was obtained. The mean particle size $d_{50}$ of the solid polymeric particles was 123 nm as measured by HPPS dynamic light scattering.

Synthesis Example 2

Preparation of Solid Polymer Particles (A)

A 2 L reaction flask fitted with an anchor stirrer, a reflux condenser and three feeding lines for feeding at room temperature, was charged under nitrogen with 907 g of deionized water, 65 g of an aqueous solution containing 57% by weight, based on the solution, of polylysine, 24 g of formic acid, 75 g of an aqueous solution containing 20% by weight, based on the solution, of polyvinyl alcohol (Mowiol™ 4-88) and 22.5 g GMA. The contents of the reaction flask were heated to 90° C. At this temperature, 0.4 g of V-50 (initiator from Wako) in 15 g deionized water was charged into the reaction flask and a monomer feed consisting of 12.8 g of styrene and 2.3 g of divinylbenzene was started and continually fed to the reaction flask for 1 hour. At the same time, an initiator feed containing 0.4 g V-50 in 15 g deionized water was started and continually fed to the reaction flask for one hour. Thereafter, 0.4 g V-50 in 15 g deionized water were charged into the flask and the resulting reaction mixture was post-polymerized at 90° C. for 1 hour and then cooled to room temperature. A dispersion of solid polymer particles (A) having a solids content of 8.7% by weight was obtained. The mean particle size $d_{50}$ of the solid polymer particles (A) was 84 nm as measured by HPPS dynamic light scattering.

Example 1 and Comparative Example 1

Preparation of A CMP Agent Containing Solid Polymer Particles (A) (Example 1) And of A CMP Agent Containing Solid Polymer Particles Having Only Amino Groups (Comparative Example 1)

Using the solid polymer particles of the synthesis example 1, the CMP agent of the comparative example 1 was prepared having the following composition: 1% by weight of solid polymer particles, 1% by weight hydrogen peroxide (D) and 0.2% by weight glycine (B). The pH of the CMP agent was adjusted to 5 with nitric acid.

Using the solid polymer particles (A) of the synthesis example 2, the CMP agent of the example 1 was prepared having the following composition: 1% by weight of solid polymer particles (A), 1% by weight hydrogen peroxide (C) and 0.2% by weight glycine (B). The pH of the CMP agent was adjusted to 5 with nitric acid.

The static etch rate SER of the CMP agent of the example 1 and the CMP agent of the comparative example 1 was determined as follows:

Copper discs were initially conditioned, washed, dried and then weighed before each experiment. The copper discs were conditioned by polishing for 30 seconds with a slurry comprising colloidal silica and ferric nitrate. The copper discs were then held by a pair of Teflon covered tongs to reduce contamination and were then directly immersed in the stirred CMP agents of the example 1 and the comparative example 1 at 50° C. The time of immersion was 5 minutes in each case. After the etching, the copper discs were cleaned with deionized water followed by an isopropyl alcohol rinse. Thereafter, the copper discs were dried with a steady stream of pressurized air, and the SER was calculated on the net weight-loss and the surface area of the disc using the following calculation:

SER=Weight-loss/[Density×(Circumferential Area+2× Area of Cross-section)×Time], wherein Weight-loss=loss of weight in copper disc after dissolution;
Density=density of copper;
Area of Cross-section=cross-section area of the disc;
Circumferential Area=circumferential area of the disc; and
Time=dissolution time.

The static etch rate SER at 50° C. of the CMP agent of the example 1 was 35 nm/min, whereas the static etch rate SER at 50° C. of the CMP agent of the comparative example 1 was 27 nm/min.

The material removal rate MRR of the CMP agent of the example 1 and of the CMP agent of the comparative example 1 was determined as follows:

Again, the copper discs were conditioned (as explained before), washed, dried and then weighed before each experiment. Thereafter, they were attached to a stainless steel carrier and then mounted on a single-side polishing machine (CMP benchtop machine of CETR, Center for Tribology, Inc., Campbell, Calif.). A polyurethane IC 1400 polishing pad was used for the experiments. The copper discs were polished for 1 min under a pressure of 17.24 kPa (2.5 psi) by supplying each of the CMP agents at a rate of 60 ml/min on the pad at room temperature. The copper discs had a rotational speed of 115 rpm and the pad had a rotational speed speed of 112 rpm. The pad was conditioned with diamond grit conditioner to remove the products of the chemical reactions and to make the pad ready for the next run. After polishing, the discs were cleaned with a deionized water rinse followed by an isopropyl alcohol rinse. Thereafter, the discs were dried with a steady stream of pressurized air, and the MRR was calculated based on the net weight-loss in the polished surface area according to the calculation:

MRR=Weight-loss/(Density×Area of Cross-section× Time);

wherein

Weight-loss=loss of weight in copper disc after polish;
Density=density of copper;
Area of Cross-section=cross-section area of the disc; and
Time=polishing time.

The material removal rate MRR of the CMP agent of the example 1 was 496.2 nm/min, whereas the material removal rate MRR of the CMP agent of the comparative example 1 was 348.3 nm/min and, thus, significantly lower than the MRR of the CMP agent of the example 1.

The ratio MRR/SER for the CMP agent of the example 1 was of 14.2, whereas the ratio MRR/SER for the CMP agent of the comparative example 1 was 12.9. Consequently, both CMP agents had comparable planarization efficiencies. However, the polished copper discs of the comparative example 1 were dull and showed staining, whereas the polished copper discs of the example 1 were shiny without stains.

The invention claimed is:

1. An aqueous polishing agent, comprising:
solid polymer particles as an abrasive, finely dispersed in an aqueous phase, and
an organic non-polymeric compound as a complexing agent, dissolved in the aqueous phase,
wherein the polymer particles comprise
a pendant functional group (a1) capable of strongly interacting with a metal of, a metal oxide on top of, or both a metal of and a metal oxide on top of a surface to be polished, and capable of forming a strong complex with the metal, and
a pendant functional group (a2) capable of interacting less strongly with the metal of the surface to be polished than the functional group (a1); and
wherein pendant functional groups (a1) are concentrated in at least one first subunit, pendant functional groups (a2) are concentrated in at least one second subunit, and the first and second subunits are oligomeric, polymeric, or both
wherein the organic, non-polymeric compound is a compound capable of interacting with the metal, the metal oxide, or both the metal and the metal oxide on top of the surface to be polished,
forming a strong, water-soluble complex with the metal, and
causing an increase of a material removal rate MRR and a static etch rate SER of the surface to be polished with increasing concentration of the organic non-polymeric compound in the aqueous polishing agent.

2. The aqueous polishing agent of claim 1, wherein the pendant functional groups (a1) and (a2) are concentrated on an outer surface of the solid polymer particles.

3. The aqueous polishing agent of claim 1, wherein the pendant functional group (a1) is a cationic group or a group capable of forming a cation in an acidic aqueous phase.

4. The aqueous polishing agent of claim 3, wherein the pendant functional group (a1) is at least one group selected from the group consisting of a primary amino group, a secondary amino group, a tertiary amino group, and a quaternary ammonium group.

5. The aqueous polishing agent of claim 1, wherein the pendant functional group (a2) is at least one group selected from the group consisting of an anionic group, a group capable of forming an anion in presence of a base, and a neutral donor group.

6. The aqueous polishing agent of claim 5, wherein
the pendant functional group (a2) is at least one anionic group selected from the group consisting of a carboxylate group, a sulfonate group, a phosphonate group,
the pendant functional group (a2) is capable of forming an anion in presence of a base and is at least one group selected from the group consisting of a carboxylic acid group, a sulfonic acid group, and a phosphonic acid group, or
the pendant functional group (a2) is at least one neutral donor group selected from the group consisting of a hydroxyl group, an aliphatic group, an aromatic ether group, an aliphatic group, and an aromatic polyether group.

7. The aqueous polishing agent of claim 1, wherein the first and second subunits are attached to a third polymeric subunit, which is essentially or completely free of the pendant functional groups (a1) and (a2).

8. The aqueous polishing agent of claim 7, wherein the third subunit comprises at least one chain selected from the group consisting of a chain obtained by condensation polymerization, a chain obtained by addition polymerization, and a chain obtained by anionic, cationic, or radical polymerization of an olefinically unsaturated monomer.

9. The aqueous polishing agent of claim 7, wherein the third polymeric subunit is cross-linked.

10. The aqueous polishing agent of claim 1, wherein at least one of the first and second subunits comprise at least one chain selected from the group consisting of a chain obtained by condensation polymerization, a chain obtained by addition polymerization, and a chain obtained by anionic, cationic or radical polymerization of an olefinically unsaturated monomer.

11. The aqueous polishing agent of claim 1,
wherein the at least one first subunit is obtained from an oligomeric or polymeric basic amino acid or polyimine, and
the at least one second subunit is at least one subunit selected from the group consisting of a polyvinyl alcohol, a polyether, a polymeric acidic amino acid, and an oligomer or polymer of olefinically unsaturated monomers comprising at least one carboxylic, sulfonic, or phosphonic acid group.

12. The aqueous polishing agent of claim 1,
wherein the solid polymer particles are obtained by
preparing a third polymeric subunit from a mixture of monomers comprising at least one monomer comprising a complementary functional group (a4) capable of reacting with the functional groups (a1) and (a2), in presence of at least one precursor oligomer or polymer of the at least one first subunit and at least one precursor oligomer or polymer of the at least one second subunit.

13. The aqueous polishing agent of claim 12, wherein the complementary functional group (a4) is an oxirane group.

14. The aqueous polishing agent of claim 1, wherein the organic non-polymeric compound is at least one compound selected from the group consisting of a polyamine, a carboxylic acid, a polyaminocarboxylic acid, and a basic amino acid.

15. The aqueous polishing agent of claim 14, wherein the organic non-polymeric compound comprises at least one basic amino acid selected from the group consisting of glycine, lysine, arginine, and histidine.

16. The aqueous polishing agent of claim 1, comprising at least one additional component selected from the group consisting of an oxidizing agent, a surfactant, a polyvalent metal ion, a pH regulator, a solid particle based on dicyandiamide and triazines containing at least one primary amino group, and a solid inorganic particle.

17. The aqueous polishing agent of claim 16, comprising an organic or inorganic peroxide.

18. The aqueous polishing agent of claim 1, wherein a pH value of the aqueous polishing agent is from 3 to 7.

19. The aqueous polishing agent of claim 1, wherein the metal is copper.

20. A process for polishing a metal surface, comprising:
preparing the aqueous polishing agent of claim 1, and
chemically and mechanically polishing the metal surface.

21. The aqueous polishing agent of claim 1, wherein the solid polymer particles are physically and/or chemically absorbed to the metal surface.

22. The aqueous polishing agent of claim 1, wherein the functional group (a1) forms a complex with the zerovalent metal atoms and/or the respective metal cations, the complex having a low dissociation constant due to a high thermodynamic and/or kinetic stability so that the chemical equilibrium is shifted to the side of the complex, and the function group (a2) forms a complex weaker than the complex formed with (a1) or does not form a complex.

23. The aqueous polishing agent of claim 1, wherein the second organic-non polymeric compound has a strong affinity to the metal surface and/or the metal oxides on top of the metal surface.

24. A process for chemical and mechanical polishing of a patterned and unstructured metal surface, comprising:
preparing an aqueous polishing agent comprising finely dispersed solid polymer particles as an abrasive and a dissolved organic non-polymeric compound as a complexing agent, and
chemically and mechanically polishing the metal surface,
wherein the solid polymer particles are interacting with a metal of, a metal oxide on top of, or both a metal of and a metal oxide on top of the surface to be polished and of forming a strong complex with the metal of the surface to be polished, and
wherein the organic non-polymeric compound is capable of interacting with a metal of, a metal oxide on top of, or both a metal of and a metal oxide on top of the surface to be polished; of forming a strong, water-soluble complex with the metal as a complexing agent; and of increasing a material removal rate MRR and a static etch rate SER of the metal surface to be polished with increasing concentration of the organic non-polymeric compound in the aqueous polishing agent.

* * * * *